US008954297B2

(12) United States Patent  (10) Patent No.: US 8,954,297 B2
Teller et al.  (45) Date of Patent: Feb. 10, 2015

(54) AUTOMATED AND INTELLIGENT STRUCTURE DESIGN GENERATION AND EXPLORATION

(75) Inventors: Eric Teller, San Francisco, CA (US); Augusto Roman, Mountain View, CA (US); Jennifer Carlile, San Francisco, CA (US); Nicholas Chim, San Francisco, CA (US); Bradley Schumitsch, San Francisco, CA (US)

(73) Assignee: Flux Factory, Inc., Sherman Oaks, CA (US)

( * ) Notice: Subject to any disclaimer, the term of this patent is extended or adjusted under 35 U.S.C. 154(b) by 475 days.

(21) Appl. No.: 13/342,162

(22) Filed: Jan. 2, 2012

(65) Prior Publication Data

US 2013/0173223 A1    Jul. 4, 2013

(51) Int. Cl.
*G06F 17/50*    (2006.01)

(52) U.S. Cl.
CPC .................................. *G06F 17/5004* (2013.01)
USPC .......................................................... 703/1

(58) Field of Classification Search
CPC ............ G06F 2217/06; G06F 17/5004; G06F 17/5009
USPC .......................................................... 703/1
See application file for complete search history.

(56) References Cited

U.S. PATENT DOCUMENTS

| | | | |
|---|---|---|---|
| 5,535,320 A | 7/1996 | Gay et al. | |
| 6,643,784 B1 | 11/2003 | McCulligh | |
| 6,859,768 B1 | 2/2005 | Wakelam et al. | |
| 6,873,942 B1 | 3/2005 | Suga | |
| 6,928,384 B2 | 8/2005 | Kochi | |
| 7,133,551 B2 | 11/2006 | Chen et al. | |
| 7,912,692 B2 | 3/2011 | Matsushita et al. | |
| 2003/0191726 A1 | 10/2003 | Kirshenbaum | |
| 2004/0254901 A1 | 12/2004 | Bonabeau et al. | |
| 2006/0075718 A1 | 4/2006 | Borne et al. | |
| 2007/0083421 A1 | 4/2007 | McNair et al. | |
| 2008/0126023 A1 | 5/2008 | Hoguet | |
| 2008/0174598 A1 | 7/2008 | Risenhoover | |
| 2009/0100368 A1 | 4/2009 | Look et al. | |

(Continued)

FOREIGN PATENT DOCUMENTS

GB         2467852 A    8/2010
WO PCT/US2012/038455    5/2012

OTHER PUBLICATIONS

Kieinger, R. et al., "Evolutionary computation and structure design: a survey of the state of the art", Computers & Structures, 83(23-24) 194301978, para. 2.1, 2.2 (2005).

(Continued)

*Primary Examiner* — Dwin M Craig
(74) *Attorney, Agent, or Firm* — KPPB LLP

(57) ABSTRACT

Computational systems and methods are disclosed that learn about and assist with appropriate structure-based design choices. The systems and methods autonomously explore design states, and suggest to a user one or more optimize design states. Constraints are provided to limit exploration to valid design states. Systems and methods are disclosed that assist groups of users with coordinating their efforts in producing a cohesive design. Systems and methods are disclosed for learning from past optimizations in order to provide more rapid convergence on an optimized design, avoid local maxima and other hurdles to optimization, avoid undesired optimizations, and so on.

20 Claims, 9 Drawing Sheets

(56) References Cited

U.S. PATENT DOCUMENTS

| | | | |
|---|---|---|---|
| 2009/0128558 | A1 | 5/2009 | Morello et al. |
| 2009/0234696 | A1 | 9/2009 | Attia |
| 2010/0049477 | A1 | 2/2010 | Sivan |
| 2010/0070241 | A1 | 3/2010 | Opdahl et al. |
| 2010/0106464 | A1 | 4/2010 | Hlasny et al. |
| 2010/0198563 | A1* | 8/2010 | Plewe ............................... 703/1 |
| 2010/0211512 | A1* | 8/2010 | Detwiler et al. .............. 705/315 |
| 2010/0257457 | A1 | 10/2010 | DeGoes |
| 2011/0010134 | A1 | 1/2011 | Balla et al. |
| 2011/0047484 | A1 | 2/2011 | Mount et al. |
| 2011/0054652 | A1 | 3/2011 | Heil |
| 2011/0191069 | A1 | 8/2011 | Madsen et al. |

OTHER PUBLICATIONS

Pablo Funes et al., "EvoCAD: Evolution-Assisted Design, Artifical Intelligence in Design )) Poster Abstracts", Key Centre of Design, Computing and Cognition, University of Sydney, pp. 21-24 (2000).

Pablo Funes et al., Evolution of Buildable Objects, Fourth European Conference on Artificial Life, pp. 358-367, Cambridge, MIT Press (1997).

Larson, K, chapter titled "Open Source Living", Building (in) The Future: Recasting Labor in Architecture, ed. Deamer and Bernstein, pp. 100-113 (Yale School of Arch., 2010).

Onuma Systems products—info at http://onuma.com/products/OnumaPlanningSystem.php (May 6, 2010).

Digital Project, Gehry Technologies—info at http://www.gehrytechnologies.com/index.php? option=com_content&task=view&id=97&Itemid=211 (2011).

Autodesk Revit—info at http://usa.autodesk.com/revit-architecture/ (2011).

Autodesk Vasari—info at http://labs.autodesk.com/utilities/vasari/ (2011).

Autodesk Ecotect Analysis—info at http://usa.autodesk.com/adsk/servlet/pc/index?siteID=123112&id=12602821 (2011).

Autodesk AutoCAD—info at http://usa.autodesk.com/autocad/ (2011).

Duke University open source structural analysis package—info at http://frame3dd.sourceforge.net/ (Sep. 13, 2011).

Graphisoft ArchiCAD—info at http://www.graphisoft.com/products/archicad/ (2011).

Chen, P. et al., "Implementation of IFC-based web server for collaborative building design between architects and structural engineers", Auto. in Constr., vol. 14, pp. 115-128 (Elsevier, Aug. 27, 2004).

Setareh, m. et al., "Development of a collaborative design tool for structural analysis in an immersive virtual environment", pp. 1-6, (Virginia Poly Tech. Inst. and State Univ., Feb. 14, 2011).

Luo, Y. "Cooperative Design in Building Construction", pp. 93-108 (Univ. Balearic Islands, Spain, May 10, 2007).

Scheer, S. "Building design teamwork supported by a collaborative CAD modeling process analysis", (Nottingham Univ. Press, May 30, 2010).

Anderson, Lee, et al. "A Virtual Environment for Conceptual Design in Architecture", International Immersive Projection Technologies Workshop, Eurographics Workshop on Virtual Environments (2003).

Miller, Brad, et al. "Genetic Algorithms, Tournament Selection, and the Effects of Noise", IlliGAL Report No. 95006, Univ. Ill. (Jul. 1995).

U.S. Appl. No. 13/112,727, filed May 20, 2011, Teller et al.
U.S. Appl. No. 13/163,307, filed Jun. 17, 2011, Teller et al.
U.S. Appl. No. 13/418,302, filed Mar. 12, 2012, Teller et al.
U.S. Appl. No. 13/163,424, filed Jun. 17, 2011, Teller et al.
U.S. Appl. No. 13/211,225, filed Aug. 16, 2011, Kaufmann et al.
U.S. Appl. No. 13/237,681, filed Sep. 20, 2011, Chim et al.
U.S. Appl. No. 13/237,735, filed Sep. 20, 2011, Chim et al.
Revit User's Guide, Apr. 2010, Autodesk, pp. 9-10,19, 32, 55-56, 523, 1029, 1102, 1106-1107, 1117, 1119, 1227-1228, 1233, 1257, 1279, 1361, 1371, 1407,1413, 1507, 1509, 1591, 1646.

* cited by examiner

AUTOMATED AND INTELLIGENT STRUCTURE DESIGN GENERATION AND EXPLORATION

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

The present disclosure is related to structure design and exploration, revision, optimization, and similar actions with regard to such designs, and more specifically to systems and methods for understanding structure design (e.g., program details) and its context (e.g., location details), extracting from actions and environments user intentions and preferences, predicting future actions and preferences, comparing structure designs, and otherwise assisting in the structure design process.

Traditionally, the process of designing and building a structure involves many professionals with many different skill sets. As an example, a developer interested in having a commercial structure built may retain an architect, who takes the developer's requirements and preferences, details about the site, building codes and the like, and first generates a conceptual design, then a more detailed schematic design. At this stage, the architect's role is to synthesize, problem solve, and design. The resulting forms, as drawn and/or modeled, are typically a blending of art and engineering. Reviews and reworking for multiple different audiences typically occur next in what is often referred to as design development. For example, an architectural engineer or similar professional may review the design and plans for the proposed structure's integrity and safety, the developer may have input for modifications to the design to meet a desired design goal, the builder may introduce limitations based on cost, time-to-completion, feasibility, and so on.

Portions of the design may also be sent to sources for cost estimates and to determine availability of elements of the structure, estimates for labor cost and time-to-delivery of components, etc. Estimates, as well as potential design modifications, from these many other sources may then also be factored into the structure design, cost, calculated time-to-completion, and so on. Bidding and negotiation may take place, such as with a builder or construction manager, parts and services providers, etc. Further design development then typically takes place to bring the design in-line with budgets, evolving design requirements, etc.

Once the final design and plans converge for the main parties of interest (developer, architect, engineer, and builder, who form the core of the ecosystem for the project), required permits and other approvals may then be sought. An additional one or more round(s) of design development take place including negotiations with certifying and permitting agencies in order to converge on a mutually acceptable design. Ultimately, construction begins and in spite of inevitable design change orders (and associated cost and time overruns) a structure is built.

While there are many other steps and parties involved, and the actual order of things may vary from structure to structure, the process is long, convoluted, circular, often unnecessarily complex, with many parties involved, and there are many opportunities for inefficiencies and delays in the various design, interaction, revision, and iteration of the design and build process. Furthermore, for each new structure, the process essentially reinvents itself from scratch, but never the same from one structure to the next. There is little re-use of designs, processes, and data in the design and construction of new structures. And, there are few resources available to improve efficiency and effectiveness in the communication and work processes taking place in the community of people and agencies involved in the design and construction process.

To this end, a number of systems have been proposed that, very broadly, modularize structure design. See, for example, the aforementioned U.S. Patent Application titled "System and Methods for Structure Design, Analysis, and Implementation", Ser. No. 13/112,727. According to that disclosure, a computer-implemented system for designing a structure and coordinating its implementation includes a design workspace, a design engine which receives various inputs and produces a structure design for display in the design workspace, a set of design requirement rules for producing the structure design, and a cell source providing a definition of a cell that forms a unit of the structure design. The cell definition may be instantiated as a plurality of cells that are assembled together with other cells to form the structure design. An attributes engine quantifies measures of various attributes of a structure based on the structure design during the process of designing the structure, and displays the quantified measures in a dashboard user interface. An optimization engine analyzes the structure design, and proposes alternative designs in an effort to improve the design from the perspective of one or more attributes, including the attributes quantified by the attributes engine.

While an automated system has been disclosed that simplifies the structure design process in many regards, the disclosed methods still leave it largely to the user to explore design options and make appropriate design choices, and to do so often from first principles for each structure being designed. There remains a need to provide improved design choice assistance to a user in the context of creating a structure design. There also remains a need for systems and methods that assist a user in the design process, particularly retaining knowledge about design choices from one design to the next. Existing design strategies also leaves it to groups of designers (and other interested parties) to coordinate their efforts in producing a cohesive design that seeks to meet the requirements of a potentially large number of individuals and groups. Accordingly there remains a need for assisting groups in coordinating their design choices. Furthermore, while the system disclosed in the aforementioned U.S. patent application Ser. No. 13/112,727 can provide optimization options, and evaluate those options for different criteria, there remains a need for techniques for learning from past optimizations in order to provide more rapid convergence on an optimized design, avoid local maxima and other hurdles to optimization, avoid undesired optimizations, and so on. Still further, there is an unfilled need for convenient, consistent, and accurate methods for comparing multiple designs in order to extract similarities and other data therefrom, extract optimal design choices, and make that data available for meaningful use.

SUMMARY

Accordingly, the present disclosure provides computer-implemented systems and methods which address the above needs. More specifically, computational systems and methods are disclosed that learn about and assist with appropriate structure-based design choices. The systems and methods assist groups of users with coordinating their efforts in producing a cohesive design. Systems and methods are disclosed for learning from past optimizations in order to provide more rapid convergence on an optimized design, avoid local maxima and other hurdles to optimization, avoid undesired optimizations, and so on. Convenient, consistent, and accurate methods for comparing multiple designs are also provided for extracting similarities and other data therefrom, and making that data available for meaningful uses.

The disclosed systems and methods employ machine learning techniques in an effort to explore a variety of different structure designs. Different design states are proposed that are likely to lead to a realizable structure ("valid design state"), and conversely rules are established that discourage (or preclude) pursuing "invalid" states (e.g., those that may lead to unrealizable structures). Furthermore, systems and methods are disclosed that seek to more quickly arrive at convergence of design on an optimal design state given weighted preferences, site specifics, and other boundary conditions. Targeted computer-implemented change-and-test methods are used to generate and evaluate modified structure designs, and a fitness function may be used to quantify designs, both machine- and human-generated. A user may select between a system-generated design or the user's own design (or some other design) for further exploration and optimization.

According to aspects of the disclosure, improved design choice assistance is provided. For example, a user is provided with a view of the cost of certain design choices. The user is also provided with a view of design states that are optimized for one or more selected (and weighted) aspects, from which a user may choose. The system and methods disclosed herein "learn" from user interaction, past design choices, additional designs, etc., improving the quality of suggested design states. The user is also prevented from making (or encouraged not to make) design choices that may lead to an invalid design.

According to additional aspects of the disclosure, certain design choice data is retained, such as from one design to another, to further assist with providing relevant and optimal design assistance. Interactions between users, and between users and the system are evaluated for further design choice data.

According to still further aspects of the disclosure, coordination of a plurality of users is facilitated by applying a uniform set of design constraints, such as when cooperatively working on a design. The constraints direct design choices such that the cooperating users' design choices converge on a coherent design.

According to yet further aspects of the disclosure, design state suggestion and evaluation constraints include rules to avoid or overcome optimization limitations, improving convergence on optimized designs. Either change operations, which take an initial design state and transform it into a new design state, or fitness functions, which evaluate design states based on weighted attributes may, or both, may include such constraints.

Still further, other aspects of the present disclosure compare different designs to extracted similarities and optimal design choices. Systems and methods disclosed herein permit "learning" what attributes make a design state successful (or not successful), so that future design choices lead more likely to future successful designs.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known processes, components, equipment, and other well-known details are merely summarized or are omitted so as not to unnecessarily obscure the details of the present invention. Thus, where details are otherwise well known, we leave it to the application of the present disclosure and the knowledge and ability of one skilled in the art to suggest or dictate choices relating to those details.

Figure 1:
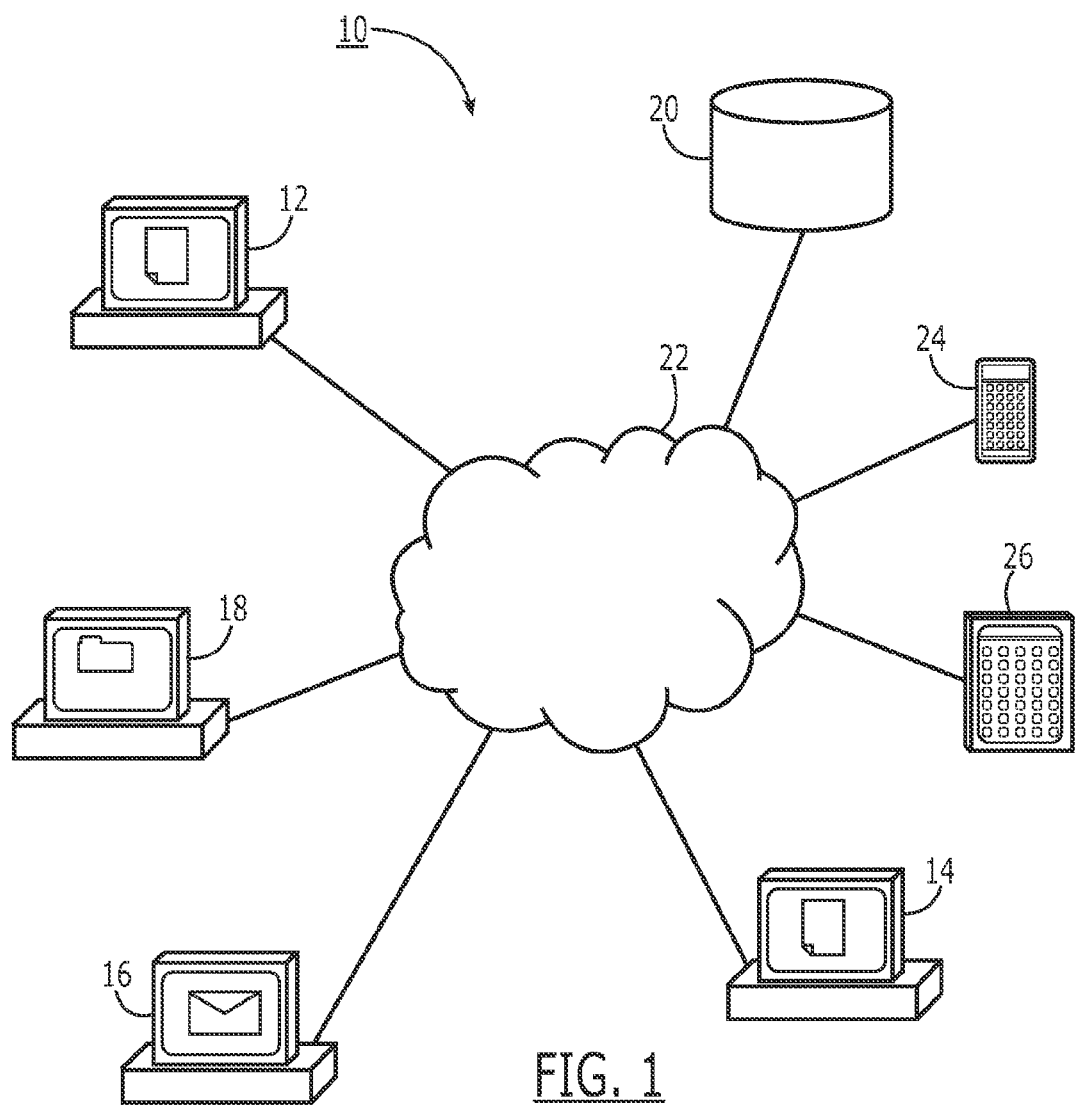
FIG. 1 is a high-level representation of a distributed network environment, comprising hardware and software, within which various embodiments of a system for structure design, analysis, and implementation according to the present disclosure may be employed.

With reference initially to FIG. 1, a distributed network environment 10 is shown, comprising hardware and software, within which various embodiments of the present disclosure may be employed. More specifically, distributed network environment 10 comprises multiple interconnected elements of hardware, each running software, allowing those elements of hardware to communicate with one another, whether by wired or wireless connection. Such elements of hardware include, but are not limited to, a first client workstation 12, a second client workstation 14, a mail server computer 16, a file server computer 18, and network appliances 20 such as remote storage, each communicating via the public Internet 22. The client workstations and servers generally may be referred to as computer devices. Other computer devices, such as mobile computationally-enabled telephone handsets (so called "smart phones") 24, tablet-style computer devices 26, and so on may also form a part of network environment 10.

Alternatives to using the public Internet, or additional interconnection mechanisms include local area networks (LANs), wide area networks (WANs), etc. Alternatives to client workstations, or additional computer mechanisms include personal computers, servers that are personal computers, minicomputers, personal digital assistants (PDAs), mainframes, etc. The network within which the various embodiments of the present disclosure operates may also comprise additional or fewer devices without affecting the scope of the present disclosure.

First and second client workstations 12, 14 may communicate via the public Internet 22 using known Web browser software or dedicated, specific-purpose application software. As is well known, software components supporting client workstations 12, 14, servers 16, 18, network appliances 20, and smart phones 24, tablet computers 26, and so on include or reference logic and/or data that may form a part of the software component or be embodied in or retrievable from some other hardware of software device or signal, either local or remote and coupled via a network or other data communications device.

Thus, embodiments of the invention may be implemented as methods, apparatus, or articles of manufacture as or in software, firmware, hardware, or any combination thereof. As used herein, article of manufacture (or alternatively, computer program product) is intended to encompass logic and/or data accessible from any computer-readable device, carrier, or media.

Those skilled in the art will recognize many modifications may be made to this exemplary environment without departing from the scope of the present disclosure. For example, it will be appreciated that aspects of the present disclosure are not dependent upon data structure formats, communications protocols, file types, operating systems, database management system, or peripheral device specifics. Accordingly, the following description is provided without reference to specific operating systems, protocols, or formats, with the understanding that one skilled in the art will readily be able to apply this disclosure to a system and format of choice.

As used herein, a "structure" may be, but is not limited to, habitable buildings, functional structures, artistic structures, and so on, and the nature of the structure does not form a limitation on the scope of the present disclosure. In addition, as used herein, "designing" is intended to mean all aspects of preparing plans for implementing a structure, including but not limited to developing a set of documents that describe a structure and aspects of its construction, as well as estimates relating to the design and construction of the structure. Designing a structure may optionally include the materials for and processes of obtaining prerequisite certifications and approvals for constructing the designed structure. In many cases, designing a structure is a collaborative endeavor between individuals and organizations. As well, as used herein, "implementation" is intended to mean verifying aspects of a design, arranging accessibility to required parts, services, and personnel, maintaining a project timeline, maintaining a project budget, managing changes during the build phase, financing and insurance, and constructing the structure. Optionally, implementation may also include coordinating and obtaining approvals, permits, and the like.

Furthermore, as used herein, "manipulation" of (or to "manipulate") a design includes but is not limited to adding elements to a design, subtracting elements from a design, reconfiguring portions of a design, moving portions of a design, partially or fully relocating a design on a site, requesting and viewing attributes about a design, implementing automated optimization of a design, checking aspects of a design for structural soundness or against codes or regulations for such a design, comparing alternative designs, developing cost estimates, construction time, and other attributes of a structure built according to a design, and so on.

Still further, as used herein, "interface" is intended to include data structures, virtual and physical connections between devices, computer-human user interface, and other mechanisms that facilitate the exchange of data between computer systems and/or control of one or more such systems. In one embodiment, an interface requires a minimum or no user data entry or manual delivery of data from one system to another. In another embodiment, data that needs to be entered manually may be retained and reused within the system, reducing future data entry requirements.

According to the present disclosure, a user interacts with a computer system and controls provided thereby to design a structure. In the process, the system may communicate with other systems to obtain data, verify data, deliver data, store or retrieve data, etc. Those other systems may be interfaces to other computer-user interactions or be autonomous or some combination of the two. By way of a network, the systems and methods thereby facilitate collaboration between multiple individuals and/or organizations in the design, analysis, and implementation of a structure.

In general, a method of designing a structure employing a system of the type disclosed herein begins with a user specifying a "program" and "location", which may be translated into requirements of the design. A program specification typically includes general aspects of the structure and its intended uses. A location specification typically includes certain starting conditions, such as a description of the site on which the structure is to be built, codes and zoning requirements, and so forth. From the program and location data, the system may provide a proposed initial design, and iterate toward meeting the design requirements. Alternatively, the user may select "cells" and/or other elements from a standard or custom palette and manipulate those elements in a design workspace to populate a structure design.

According to the present disclosure, a cell is a fundamental element employed by the system and user to design a structure. Cells are abstractions of portions of a structure (although in certain cases a structure may in fact be comprised of a single cell) upon which other systems in the design depend. Cells are instantiated as part of the design process. Cells include rules governing aspects of the instantiations, such as how an instance of one cell connects to another instance, size ranges of instances, systems or components included in or required by an instance, and so on.

Figure 2:
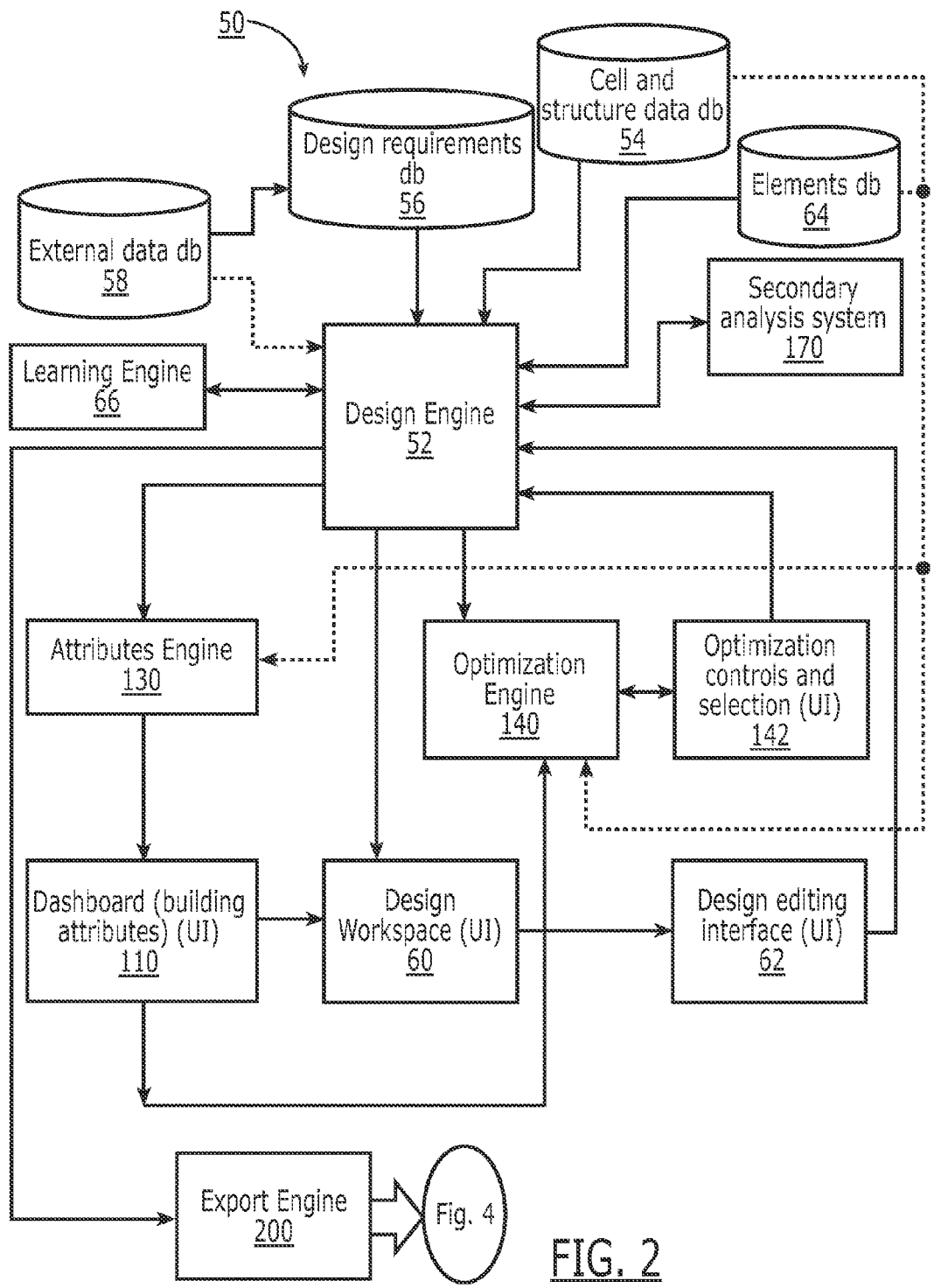
FIG. 2 is a schematic diagram of a portion of a first embodiment of a computer-implemented system for structure design, analysis, and implementation including a learning engine according to the present disclosure.

Referring to FIG. 2, there is shown therein a schematic diagram of a portion of a first embodiment of a computer-implemented system 50 for designing a structure and coordinating its implementation according to the present disclosure. System 50 comprises a design engine 52 that manages aspects of the structure design process. Design engine 52 may be realized in software, firmware, hardware, etc.

Design engine 52 receives various inputs including data from cell and structure data database 54, program and location data from design requirements database 56, and optionally additional data from external data database 58 and elements database 64 interconnected thereto. While these data inputs are shown and discussed in terms of databases, it will be appreciated that other forms of data input, such as streaming data, real-time measurement data, calculated data, etc. may also be employed.

Design engine 52 provides an output in the form of data representing a structure that is rendered in a design workspace user interface (UI) 60. Design engine 52 may include rendering capabilities, or may rely on additional tools, such as Google SketchUp to perform rendering tasks. Design workspace UI 60 provides a user with a visual representation of the structure being designed, as well as a design-editing interface 62 at which a user may edit the design.

Figure 3:
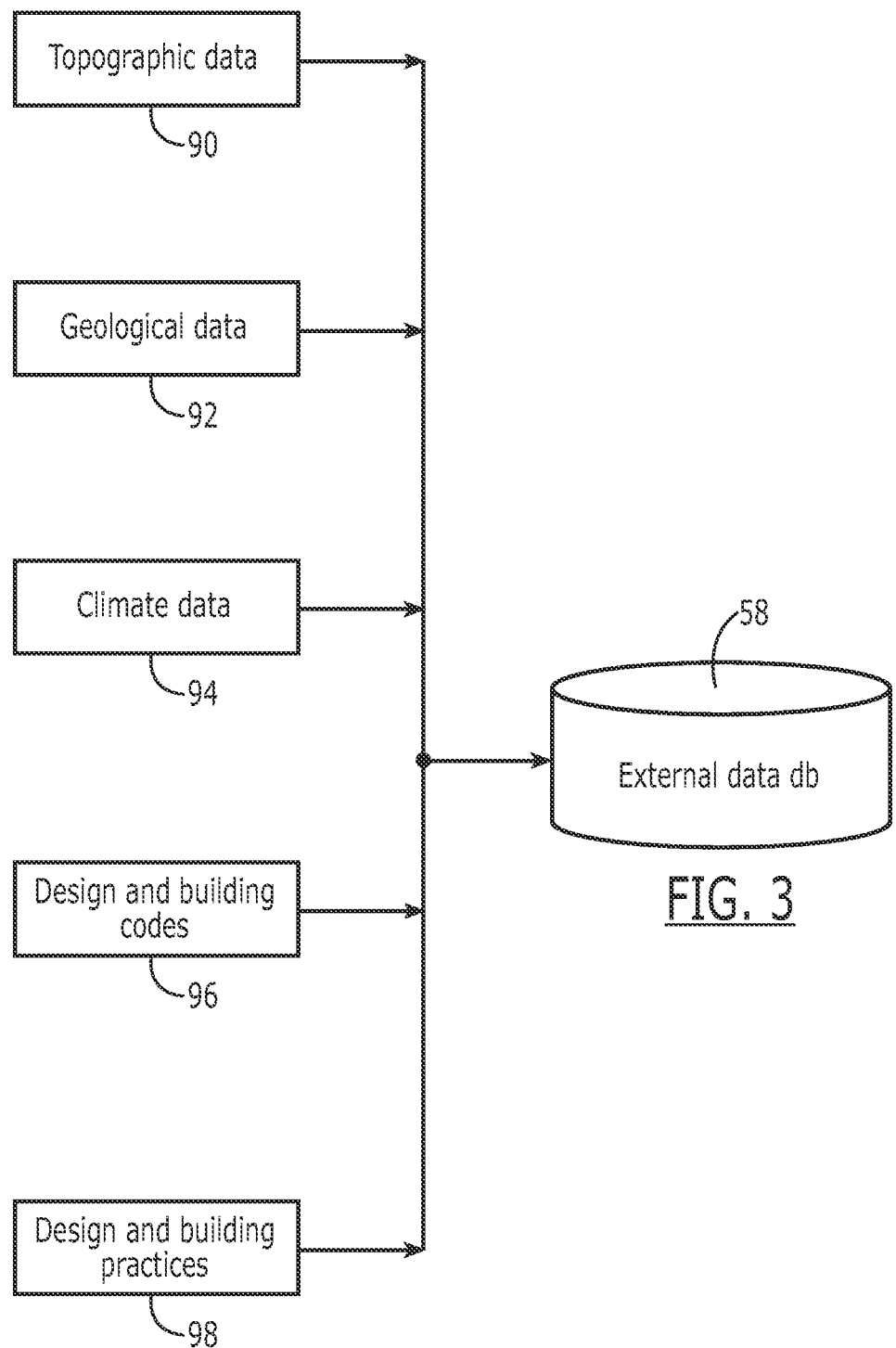
FIG. 3 is an illustration of one embodiment of an external data database configured to receive data from a number of sources external to the system for structure design and analysis according to the present disclosure.

Design requirements database 56 may also provide design engine 52 with rules driven by certain external data provided by external data database 58. FIG. 3 illustrates a number of representative sources of this external data. For example, data from a topographic study may be utilized by design requirements database 56 to provide rules for design engine 52. Similarly, geologic data 92, climate data 94, design and building code data 96, and generally accepted design and building practice data 98 may suggest or require design rules be implemented by design engine 52. Other external data include zoning data, historical real estate data, neighborhood information (key services, pedestrian and vehicular traffic flow), physical form of neighboring buildings, etc., not shown) may also be provided to external data database 58 for use by design engine 52.

Returning to FIG. 2, during the design phase of a project, the structure produced by design engine 52 improves in an effort to meet the various requirements of the interested parties. In certain stages of the design process, design evolution is by way of the interaction of various parties and organizations through direct manipulation of elements of the design provided by way of an interface such as user design editing interface 62 and inputs from various secondary data sources and analysis systems.

Figure 4:
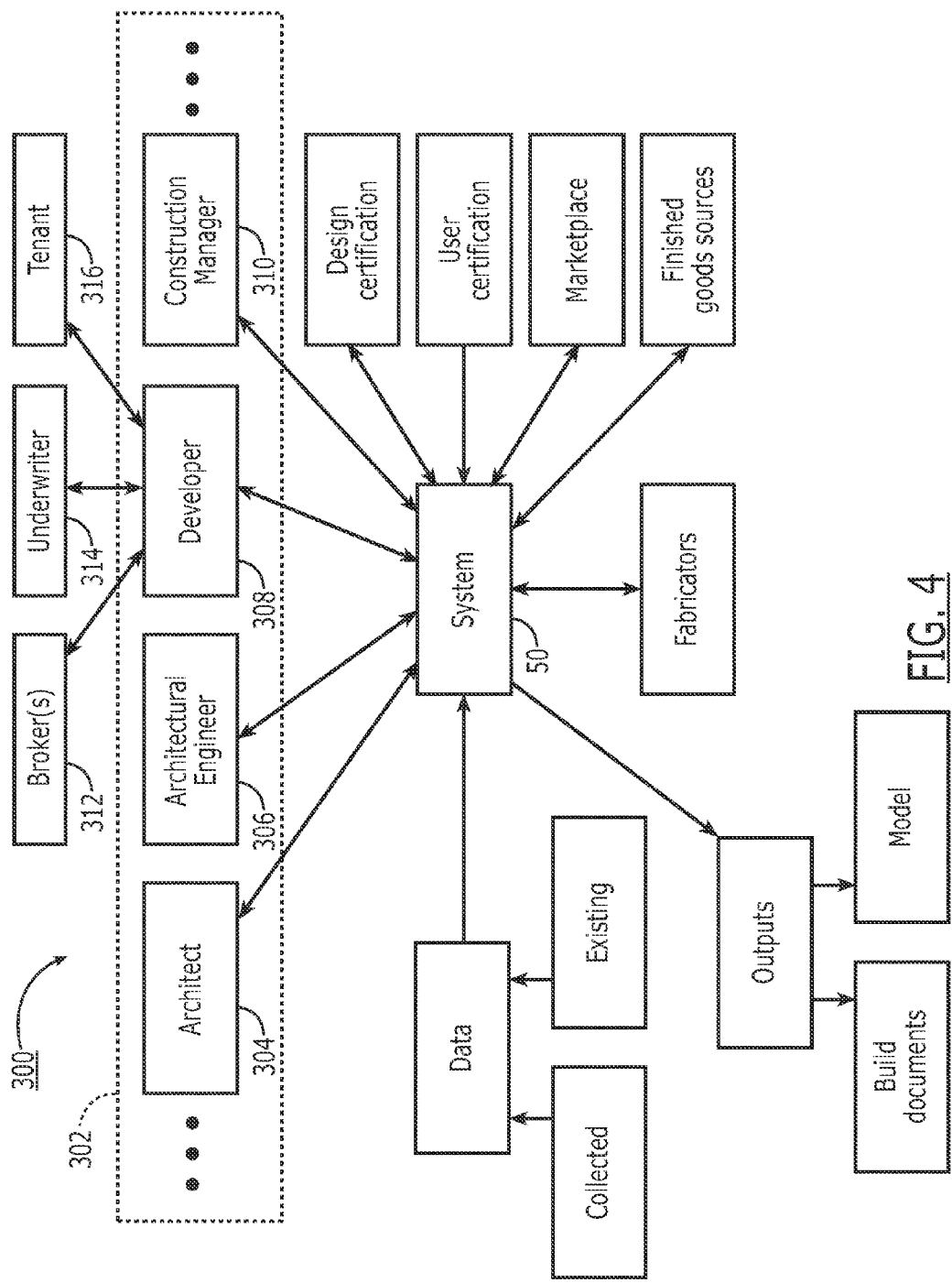
FIG. 4 is an illustration of one exemplary structure design environment including a number of the relevant participants in the design evolution, analysis, and implementation process.

FIG. 4 is an illustration of one exemplary structure design environment 300 including a number of the relevant participants in the design evolution, analysis, and implementation process, operating around system 50. Traditional design participants 302 include one or more architects 304, architectural engineers 306, developers 308, construction managers 310, and so on. Other parties that may be directly or indirectly involved in the design process include property broker 312, project underwriter 314, property tenant 316, and so on. Any two or more of such parties, and two or more individuals within organizations serving these roles, may wish to collaborate on a structure design. For example, an architectural firm may wish that a senior architect work with a junior architect to develop a design for a client. An architect may wish to deliver a design to an architectural engineer so that structural details can be resolved. A developer may wish to involve a tenant in design details, and so on.

Many of the various interactions that the participants identified in FIG. 4 (and possibly additional participants) have with a design (such as one in progress), with each other, with past designs, with systems related to the design process (e.g., secondary analysis system 170 of FIG. 2), etc. by way of system 50 may form a source of knowledge about the design process, about the preferences and choices of the participants, about optimization of a design, about similarities to other designs, about cohesiveness of a design involving multiple participants, and so on. Viewing the data represented by these interactions over time, an opportunity is presented for "learning" from that data. Returning again to FIG. 2, system 50 is therefore provided with a learning engine 66, explained in further detail below, which process interactions such as between users via the system, between a user and the system, and between one system and another similar system, and/or analyzes structure designs with an aim to "learn" from those interactions, abstract that learning, and synthesize rules and processes to assist with the design process.

Learning engine 66 may support one or more of a number of different types of learning strategies and goals. Learning strategies include (but are not limited to) unsupervised or supervised learning, reinforcement learning (learning from responses to state changes), pattern recognition, and so forth. The learning that the system does (i.e., some attempt to take the system from a current state to an improved state as measured by the fitness function) could be accomplished either by a search process or a derivation process. A search process (for example stochastic beam search) starts from one or more "states" and explores nearby states (e.g., modifies the current state in some way to produce a new state, and evaluates that new state). Typically, the search employs a form of "gradient ascent" to ensure that steps to nearby states head in the direction (in fitness space) tending towards an improved design. Furthermore, it is known that search processes may have mechanisms to overcome local maxima. Alternatively, a constructive process for learning utilizes rules (that can improve over time) applied in a systematic way to derive an improvement in structure design, with search through many intermediate structure designs in the process. Goals include (but are not limited to) improved design choice assistance, retention of relevant design choice data (such as from one design to another), coordination of a plurality of users, improved convergence on optimized designs (and avoiding or overcoming optimization limitations), comparing designs to extract similarities and optimal design choices, and so on. In general, the goal is to provide an improvement in the response of design engine 52 so that it may provide a more desired design or design choices as an output.

In the present case, "desired" is measured by calculation of a fitness function. In its most broad sense, fitness function (F) as used here refers to a value that is a function of one or more weighted attributes, $F=f(\vec{w}_1 \vec{a}_1, \vec{w}_2 \vec{a}_2 \ldots \vec{w}_n \vec{a}_n)$, where $a_1$, $a_2, \ldots a_n$ are each quantifications of an attribute of a structure based on the structure design, and $w_1, w_2, \ldots w_n$ are each weighting values corresponding to each attribute quantification, respectively. For a more detailed discussion regarding fitness function in the context of a structure design system, see application Ser. No. 13/163,424, titled "Quantification of Structure Fitness Enabling Evaluation and Comparison of Structure Designs", which is incorporated herein by reference. Calculation of fitness function may be managed, for example, by optimization engine 140 of FIG. 2.

Figure 5:
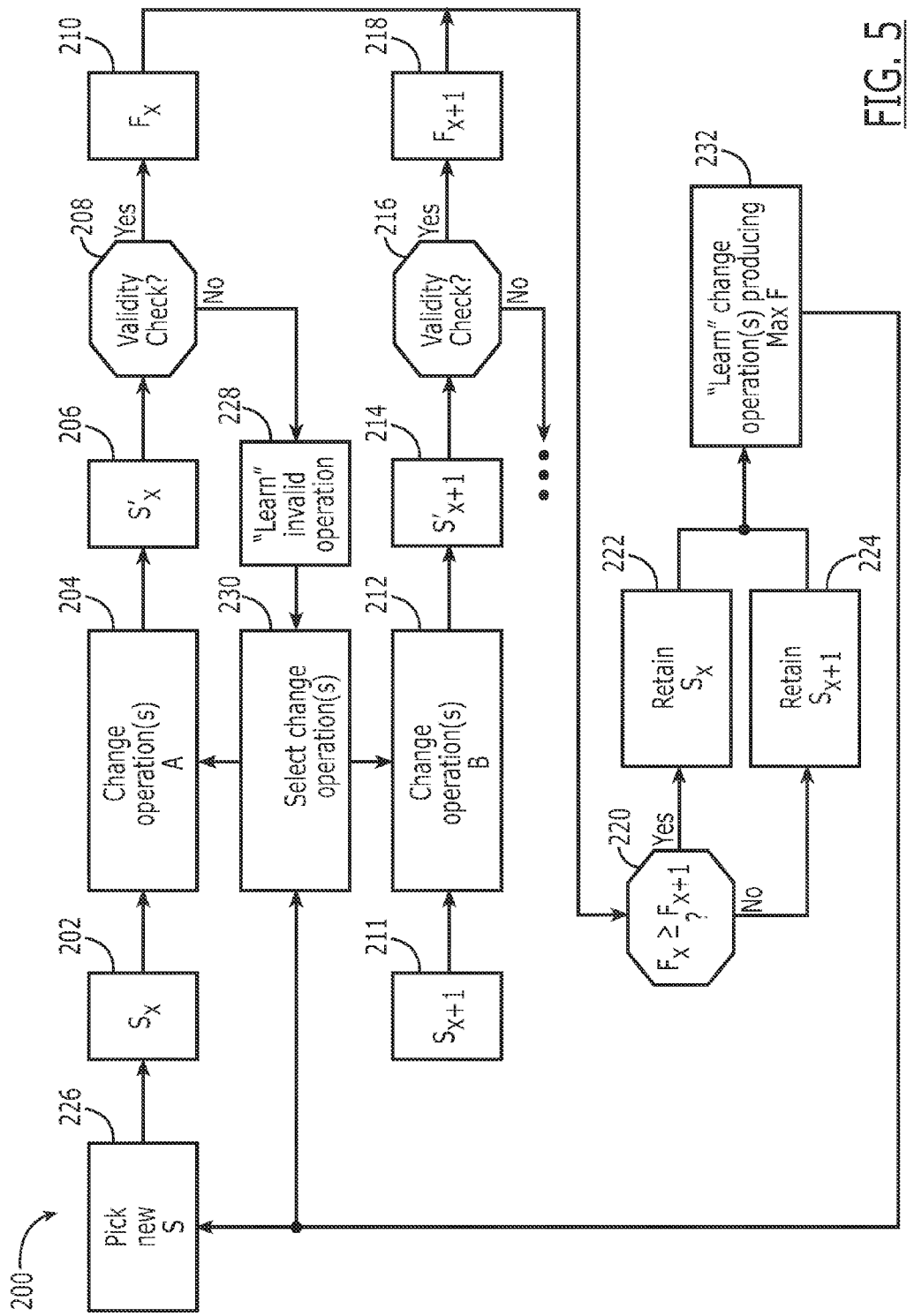
FIG. 5 is a flow diagram illustrating a number of aspects of a change-and-learn process in the context of a structure design process according to an embodiment of the present disclosure.

With reference to FIG. 5, an embodiment 200 of the present disclosure is illustrated. According to embodiment 200, an initial structure design or state $S_x$ (202) is stored, such as in memory associated with the design engine (52). Design state $S_x$ may be a user-entered design, a manually or automatically selected seed design, a machine-generated design, or may be established by some other mechanism. In the design process, initial design state $S_x$ is changed in some way, by application of one or more modifications, to a new design state $S_x'$ (206). A layer of abstraction, referred to as a cell, is provided as an element of the structure design. The system includes processes, based on the cell abstraction, that manage details required to connect or disconnect a cell from a structure design (i.e., other cells). HVAC routing and interconnection, structural integrity, egress requirements, etc. are examples of details managed by the system in response to the addition or removal of a cell. Thus, the cell abstraction, and the system's rules for structure design using cells, is such that the addition or removal of cells, and hence basic design modification always result in an acceptable (e.g., buildable) state. Thus, the cell approach dramatically improves the chances of obtaining an acceptable structure from a system's own (i.e., autonomous) structure design modifications when compared to results of autonomously added and removed beams, columns, floors, and walls when done one element at a time.

In a design process supported by automated design exploration, such as disclosed in the aforementioned U.S. patent application Ser. No. 13/112,727, the one or more modifications may be either user-entered or machine-generated. In the case of machine generation, an operator referred to as a change operation is applied to transform an initial design state S to a new design state S'. In the example of FIG. 5, change operation A (204) is applied to $S_x$ (202) to arrive at new design state $S_x'$ (206).

Change operation(s) may be selected by the system from a specified population of such change operation(s) retained in an appropriate storage mechanism (not shown). In certain embodiments, the population of change operations is fixed, and a user is provided with the ability to select from among the fixed population. In other embodiments, an interface may be provided to permit a user to order operations to be explored, such as by applying a weighting to certain types of operations. In such a case, the user may guide the system in preferentially exploring certain design states, even to the extent of the system mimicking the actual preferences of the user (such that the system develops structure designs more similar to what the user might actually have produced themselves). In still other embodiments, an interface is provide permitting the user to edit the population of change operations, including creating new operations, deleting, and modifying existing operations, creating composite change operations from multiple change operations, etc.

Change operations act on one or more cells of a structure design. According to an embodiment of the present disclosure, the fundamental unit from which structures are built is referred to as a cell. In one limited sense, a cell may be thought of as a building block for a structure. Change operations may therefore represent manipulations of portions of a design on a cell-by-cell basis. For example, a partial list of primitive change operations includes: "add" a cell, "delete" a cell, and "rotate" a cell. Many compound change operations can be obtained from combinations of these primitives. For example, a change operation to "move" a cell may be obtained from "delete" a cell then "add" that same cell at a different location. A "curve" change operation may "delete" a cubic cell and in its place "add" a cell having one or more curved sides (e.g., to replace a sharp corner with a rounded one). Partial- or whole-structure change operations are also contemplated, such as "flatten" a structure, in which cells from higher elevation points of a structure are moved to lower elevation points of the structure. A "heighten" a structure change operation may result in cells being added to the top of a structure design, in some cases with a commensurate removal of cells from elsewhere in the structure. A "copy floor" change operation is a series of "add" cell change operations, where the cells of the reference (copied) floor are used to select cells for the target (added) floor. Many of the change operations also have inverse operations, such as "delete floor", which as the name suggests, removes all cells on a designated floor of the structure design.

Figure 6A:
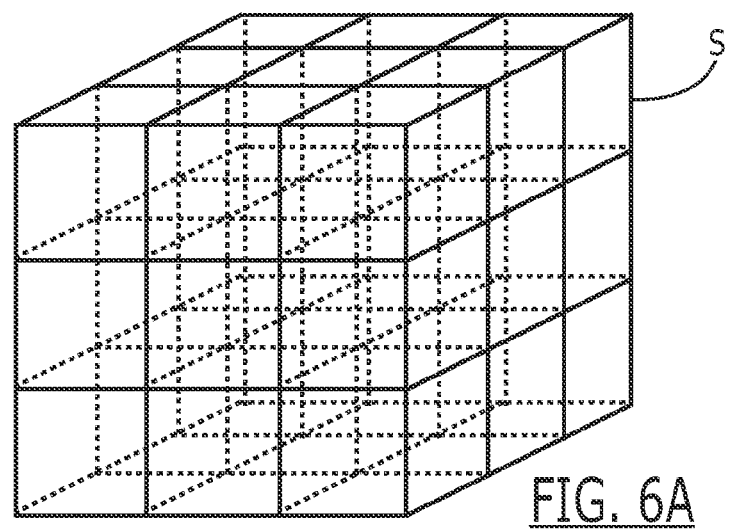
FIGS. 6A through 6C illustrate an initial structure state, a new structure state obtained from application of a compound change operation to the initial state, and a flow representation of that exemplary compound change operation, respectively, according to an embodiment of the present disclosure.
Figure 6B:
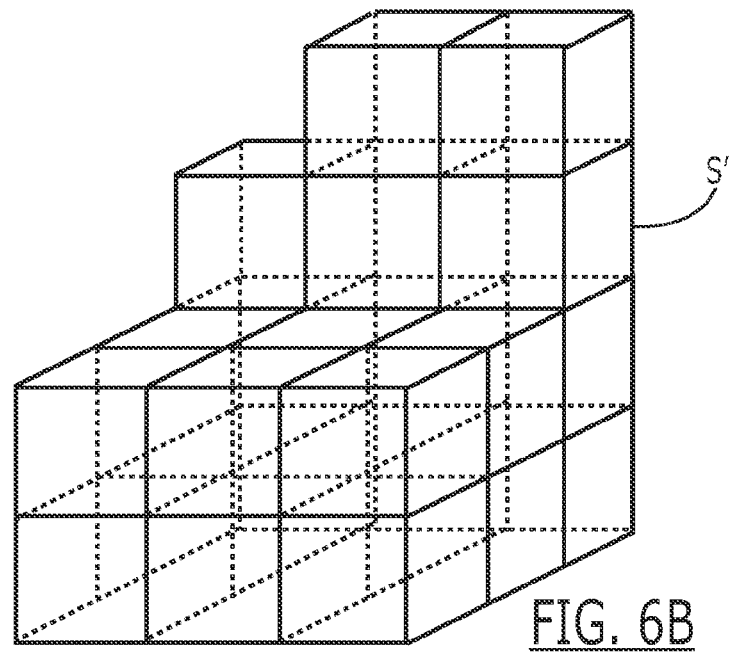
Figure 6C:
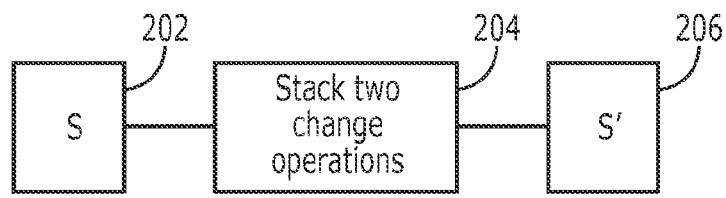

An example of a compound change operation is illustrated with reference to FIGS. 6A through 6C. FIG. 6A shows an initial design state S comprised of 27 cells (arranged in a cubic form). A compound change operation (which we will call a "stack two" change operation) produces a new design state S', shown in FIG. 6B. New design state S' is obtained by a "delete" of 6 cells from the front, top layer of structure S, then an "add" of two cells (the stack two) to the top of back row, top layer. Thus, the "stack two" change operation is comprised of six "delete" operations, and two "add" operations. This is represented in notation form in FIG. 6C.

Returning to FIG. 5, once a new structure $S_x'$ is obtained, a check is performed to ensure that $S_x'$ is a "valid" design (208). In various embodiments of the present disclosure, certain designs restrictions are imposed so that the design can reasonably be implemented (e.g., the structure is buildable, reasonable estimates can be provided, materials can actually be obtained, and so on). A number of cell-based rules may be applied to test S' for validity, such as that no cell is to be unsupported at its base (i.e., no overhangs), no structure may have two unconnected cells as its top layer, each cell of a structure must be contiguous with at least one other cell of the structure, and so on. The list of possible cell-based rules is arbitrary, may be quite large, and may depend upon the specific project for which a design is being developed. In certain embodiments, a user may manually override system decisions with respect to validity, thereby obtaining a structure design that might otherwise be invalid but which permits the user to explore aspects of the design regardless.

If a new structure $S_x'$ is deemed to violate one or more rules it may be abandoned (or at least retained only for the purpose of avoiding that state in the future), and a new change operation B (212) is applied to design $S_x$, producing a different new design state $S_{x+1}'$. If, however, $S_x'$ is deemed valid, then a fitness function $F_x$ (210) is computed for that structure design state. The fitness function may, for example, determine how closely the square footage of the structure design matches the target square footage set by the user, may determine whether the estimated build cost exceeds the set build cost target, may determine whether the calculated return-on-investment (ROI) meets or exceed the target ROI, may determine if the design state exhibits the desired level of symmetry, weighted as appropriate, and so on. There are many attributes of a design that may be measured and weighted from which the fitness function value $F_x$ may be determined. This value $F_x$ is associated with design state $S_x'$ in memory.

It will be appreciated that the process illustrated in FIG. 5 is a snapshot at a point after initiation of the change-and-test process, and before the final state is determined. Entering and ending the process of FIG. 5 will be well understood by one of skill in the art from the description hereof.

As further illustrated in FIG. 5, the process of modifying an initial design state $S_x$ may be repeated for a variety of different change operations, and the fitness function for each valid new design compared in order to arrive at a relative "optimum" design, from a fitness function perspective. That is, a large number of design variations may be explored and the design state presenting the greatest fitness function selected as "optimum". This may take place in a serial fashion, in which the fitness function value $F_x$ for design state $S_x$ is compared with the fitness function value $F_{x+1}$ for design state $S_{x+1}$ (220), retaining only (or keeping track of) the design with highest value (222, 224), and at some point in the process the collection of fitness function values compared to rank them. In an alternative serial embodiment (not shown), the current highest fitness function value is compared with a current state's fitness function value, and the state with the higher fitness function value retained. This process, of starting from some point in the space of possible models, trying out a range of slightly modified models, examining each new model variation for its fitness, picking the most fit model (possibly the original model), and repeating this process many times is called, in machine learning, "hill climbing." (It is also referred to as gradient ascent, such as used above). A new initial state may then be selected (226), such as the last new design state, for application of change operations and further exploration of alternative designs.

It will be appreciated that each new design with an improved fitness function value may form a starting point for the change-and-test process described above. After a number of (possibly many) iterations, a design may be arrived at that has a highest fitness function value. That design may be presented to a user for consideration as a possible solution to the design issues for a structure. This process may be adequate and sufficient to obtain an optimized design for many structure programs. However, for other structure programs several issues may arise. First, the "cost" (compute time, memory requirements, etc.) of calculating and comparing a large number of iterations may be excessive or even prohibitive. Second, the process may lead to local optimization, and may require additional techniques to push continued change-and-test toward an optimal design (e.g., a global maximum). Third, during the process of iterating, the user may wish to make one or more changes to the structure design from which the change-and-test process is required to proceed. Fourth, two users working in parallel on a design may unknowingly constrain the system to pursue different or divergent designs.

Accordingly, in an embodiment of the present disclosure learning engine 66 (FIG. 2) tracks change operations (228) leading to design states (as determined at 208). This information is then used when selecting change operations (230) that are applied to an initial design state (204). Preference is given to change operations that have produced valid design states over those that have produced invalid design states. Weighting (or conversely negative weighting) is one method for applying such a preference (negative preference). In this way, change operations are selected that have a higher likelihood of resulting in a valid design state.

Furthermore, learning engine 66 (FIG. 2) tracks change operations associated with comparison of fitness function values (as determined at 220). This information is further used when selecting change operations (230) that are applied to an initial design state (204). Preference is given to change operations that have produced a higher fitness function value over those that have produced a lower fitness function value. Weighting is one method for applying such a preference. In this way, change operations are selected that have a higher rate of convergence on an optimized design state. Given a weighted set of change operations, a best-first search may be used to add a level of selectivity to which state changes to pursue—only those states that are predicted to have a high likelihood of producing improved fitness function values are retained and further explored. Beam search is an example of such a best-first analysis.

A reduction in the number of iterations required to obtain an optimized design by the process described above may be obtained by structuring the change operations themselves such that the current initial design state S is not changed if the change to new design state S' would be invalid, i.e., obviating the separate validity check step. The following is provided as an example of pseudocode for such a conditional change:

Identify a target cell for change operation
    Choose one of K change operations (e.g., delete cell)
        if change operation to cell does not
            orphan a cell adjacent target cell or
            remove support for a cell located above target cell or
            remove a fundamental structure system
        then perform change operation on target cell
        else select new change operation Of course, any one or more cell-based rule governing validity, such as those discussed above with regard to separate generation then testing of a new design state S', may also be used within the model of integrated change operation and validity assurance.

Eliminating pursuit of invalid states and increasing the rate of convergence on optimized designs relates to the "cost" of generating a complete structure design. Once cells are assembled into a design state, to produce a complete structure design the design state must be essentially "compiled" to integrate the cells and the functions they carry into a cohesive structure design. The process of compiling a structure can be computationally costly. For example, all cell-to-cell interconnections (mechanical, electrical, plumbing—MEP) must be worked out and verified, total cost and build times must be calculated, secondary systems run (e.g., structural engineering analysis packages), and so on. It is therefore desired to minimize recompiling. It is possible to alter a "compiled" structure design, but doing so will require recompilation. Even small modifications to a compiled design can result in many changes to the overall design (e.g., removing a cell may mandate moving a core, removing an elevator, rerouting MEP, changing beam specifications, etc.) Thus, there is strong motivation to avoid recompiling after each change to a design state.

Invalid design states are those that cannot be built, that undermine fundamental assumptions of the design process, that are directly in conflict with required design attributes, and so on. Essentially, there is a very high certainty that such designs will be rejected. By anticipating that a design state will be "invalid", the system disclosed herein can guide a user toward promising designs, reduce time and effort spent on what ultimately would be invalid designs, and reduce the number of structure compilations and associated cost. In general, by knowledgably selecting change operations as disclosed above to those likely to result in "valid" designs, the user may explore design choices without concern that the result will be invalid—what the system lets the user try will at least be buildable (if not the design the user ultimately desires).

Figure 7:
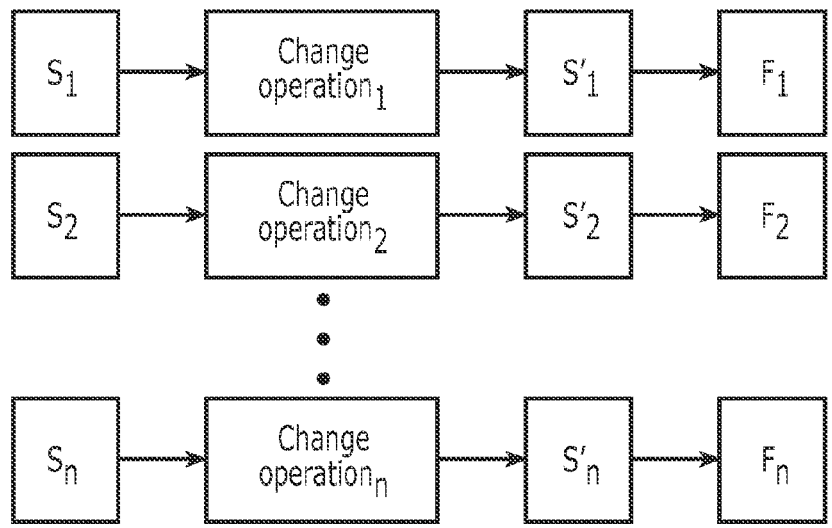
FIG. 7 is an illustration of multiple change operations applied to multiple initial structure design states to produce multiple new structure design states that may be evaluated in parallel, according to an embodiment of the present disclosure.

With reference to FIG. 7, a method of selecting design states for change operations is illustrated. Such methods may also impact the cost of convergence on an optimized design state. A number n of selected initial states $S_1, S_2, \ldots S_n$, (from a population of N initial states, where n<N, for example from prior change-and-test iterations) are each subjected to a different change operation to produce a unique new design state $S'_1, S'_2, \ldots S'_n$, respectively. A fitness function value $F_1, F_2, \ldots F_n$ is determined for each new design state $S'_1$, $S'_2, \ldots S'_n$, respectively. If the fitness function value for the new design state is an improvement over that of the corresponding initial design state, the new design state may replace the corresponding initial design state (referred to as replacement). Methods such as tournament selection (with replacement) may be employed to select sets of n initial states $S_1$, $S_2, \ldots S_n$, for each round such that a relatively more efficient and lower cost process for evaluating a potentially large data set is provided as compared to sequentially evaluating each possible new design state.

It will be appreciated that the methods disclosed above provide compact, discrete, and "valid" steps towards an optimized structure design state. Each structure design iteration has a high likelihood of a non-zero fitness function value, meaning that a number of potentially worthwhile design alternatives can explored. Various "good" designs may then be explored, and/or a "best" design option offered to the user.

It will also be appreciated that while several attributes (e.g., square footage, build cost, time to completion, etc.) that may be explicitly selected (and weighted) by a user have been discussed above, many different attributes may be evaluated when calculating a fitness function value. For example, attributes may be virtually any user-specifiable aspect directly related to a structure design, the design process, and the structure building process (subcontractor availability, code compliance, cost of operation, environmental footprint, etc.) Attributes may also be indirectly related to the structure design, such as proximity of the structure being designed to similar-sized structures, return-on-investment (ROI) of similar-sized structures in proximity to the structure being designed, cost of insurance per square foot in the neighborhood of the proposed structure site, and so forth. The user may be provided with an interface for selecting attributes, and specifying the relative importance (weight) to be given to each selected attribute as compared to other attributes (e.g., square footage is twice as important as maximal light plane). In addition to explicit attributes, implicit attributes may also be considered. For example, a fitness function may comprise both explicit and implicit attributes (meaning they are part of the fitness function but possibly may not be specified by a user). For example, it may be assumed that a user would be interested in the symmetry of a design, even if that attribute is not explicitly selected. Therefore, unless removed by the user from the attributes list, the symmetry of a design state may be quantified, and that value considered as part of the fitness function. Symmetry is one example of a large possible list of implicit attributes considered when evaluating structure fitness. Therefore, the above should not be interpreted as limiting the present disclosure to any set or type of such attributes.

Furthermore, it will be appreciated that while change operations and design states have been described above in terms of the overall form of a structure (i.e., what the entire structure looks like, particularly when viewed from the outside), the above process may operate equally on portions of the structure either by specifying those portions to be explored, specifying those portions to be excluded from exploration or both (as may, for example, be specified by a user). For example, a user may specify that the footprint of the structure cannot be changed, but that within that footprint, alternate design states may be generated and explored. These limitations may form added cell-change rules as discussed above, may disable certain change operations, or be implemented by other controls within the system. Likewise, the above process may operate equally on internal elements and systems of a structure design (again as may be specified by a user), leaving the form of a structure unchanged (or changed only in response to optimization of internal elements and systems).

The embodiments described above operate on a prescribed set of change operations, and proceed somewhat autonomously and arbitrarily through the population of such change operations in producing and exploring new design states. However, it is within the scope of the present disclosure that the system "learn" from user interaction with the system (and with other users via the system), and from any and all other available sources making design choices in the context of the system disclosed herein.

Figure 8:
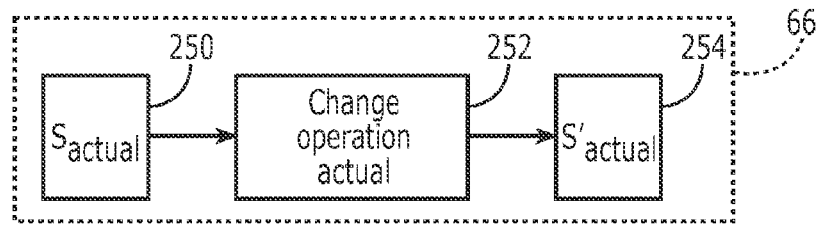
FIG. 8 is an illustration of a training mode for a computer-implemented system for developing a structure design, according to an embodiment of the present disclosure.

According to another embodiment disclosed herein, a system is initially (or otherwise from time to time) trained, in the sense of supervised machine learning. For example, with reference to FIG. 8, a user access a first structure design state S (250), applies one or more change operations (252), and obtains a new design state S' (254). The system may derive from this that there is a probability that when the user wishes to change a design state from S to S' in the future, the user will prefer to do so by way of either the specific change operation or similar change operations used in the training example (252). If this pattern is observed in different contexts, the system may derive that there is a probability that the new design state S' is a generally desired state. For example, if the user applies the "curve" cell change operation to multiple corner cells, the system may determine that there is a probability that the user wishes all similarly positioned corner cells to be curved (e.g., to change from a rectangular footprint to a curved footprint). This learning may be implemented by the system weighting such user-preferred change operations (as associated fitness functions) when exploring its own design states (e.g., when noting that the user appears to prefer rounded corners, the system may weight its change operations and/or fitness functions to also prefer rounded corners).

Figure 9:
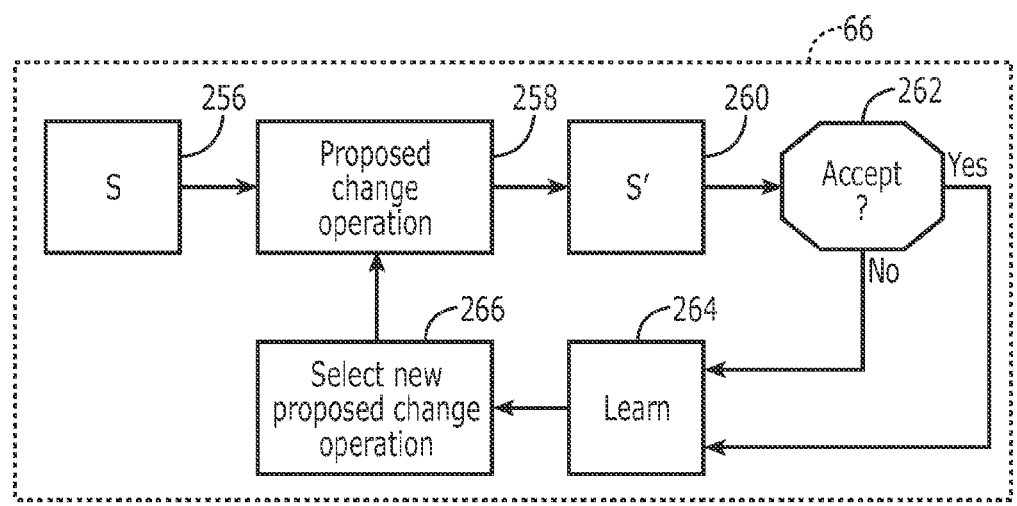
FIG. 9 is another illustration of a training mode for a computer-implemented system for developing a structure design, according to an embodiment of the present disclosure.

According to another example of a process for training a learning engine 66, shown in FIG. 9, a user access a first structure design state S (256), and a selection mechanism (not shown) forming a part of learning engine 66 selects then applies one or more change operations (258), and obtains a new design state S' (260). The new design state S' is tested (262) for acceptability to the user (e.g., is it an acceptable new state to the user). The system may then learn from the user's response regarding acceptability whether the proposed change operation is generally acceptable or unacceptable to the user. This may be recorded (264) and a new proposed change operation applied and tested (266).

In certain cases, learning may be of user preferences (also applies to groups of users). In other cases, learning may be with regard to valid and invalid design states. For example, if the system proposes a structure that is outside of the designated footprint for the structure (e.g., encroaches within setbacks), the user may mark the design state as illegal. Learning engine 66 may "learn" from a number of such instances that any design state that is outside of the footprint is invalid. This may be implemented, for example, by way of a contingent value for the fitness function $F_x$ for a design state $S_x$, such as:

If any portion of structure for design state $S_x$ is outside of permissible footprint
  then set $F_x$ to 0 (or $-\infty$)
  else calculate $F_x$ Alternatively, you can put a sizable but non-infinite penalty on the fitness of an unacceptable (invalid) design. This may allow the system to continue on from that state and back into a better and now valid state that would have been hard to arrive at without going through a series of design steps that are invalid. And, of course, the system may be explicitly programmed to include such rules in addition to learning from the user(s). This may be by way of programming a system for building codes, zoning ordinances, and so on.

In a variation on the above training operation, the change-and-test operation may be applied against a number of existing structure designs so that user involvement in the training phase is minimized. This may generate a very large training set reasonably quickly (as may many of the other processes discussed or suggested herein). Known techniques such (e.g., gradient descent) may be employed to determine parameters for modeling (e.g., logistic regression analysis) of the training set and building a learning model for structure design. The learning in this context may be verified with the user (such as periodic confirmation of design choices) in what is referred to as semi-supervised learning.

All learning discussed herein may be intra-structural (i.e., applied on or to the structure within which the training takes place). For example, it may be that a user prefers that all corners on a specific design be rounded, but apply that rule only to the specific design. Likewise, some or all learning discussed herein may be inter-structural (i.e., applies to structures other than just the structure in which the training takes place). For example, the system may learn that preferred structures have a reception lobby on the ground floor, and select change operations to provide same in all designs.

In addition, the learning may be specific to an individual user (i.e., learning rules applied on a user-by-user basis). For example, the system may learn through training (or otherwise as disclosed herein) that User One prefers glass exteriors, while User Two prefers steel paneling with inset windows. Alternatively, the learning may be general to some or all users of the system. For example, a system may "learn" that designers from a design firm have a preference for pyramid-topped designs. (Of course, if the firm is known for such designs, the system may be configured, through change operations and fitness function definitions, to produce designs that have pyramid tops for all users at that firm).

Learning as described above may result in limiting (or adding to) the population of change operators. Likewise, the learning may result in changes to the fitness function, such as adding additional attributes (e.g., pyramid top), changing weights of attributes, and so on. It follows that in certain embodiments learning may result in changes to both change operations and fitness function.

Learning may also proceed unsupervised (again, inter- or intra-design, and for a specific user or group of users). Unsupervised learning may result from examination of user interactions with the system during the design process, interactions between users within the system (for collaborative aspects of a system of the type disclosed herein, see the aforementioned U.S. patent application Ser. No. 13/163,307), results from actions that are internal to the system, and so on. For example, suppose that after a number of design cycles, each producing a final design (i.e., different projects), each final design was symmetrical about normal central vertical planes. This may, for example, be determined by a routine running within the system that looks for similarities between final designs. The system may learn from this that there is a preference that all designs should be symmetrical about normal central vertical planes. The system may thus increase a weight of a fitness function attribute corresponding to symmetry about normal central vertical planes. Work in the field of computer science in this area is often referred to as "clustering", which is related to the field of unsupervised learning.

As another example, the history of change operations resulting in new fitness function values may be evaluated (mined) for patterns. Change operations that statistically lead to improved and/or optimized design states may be given a higher relative preference (or weight) when selecting change operations for future design explorations. Likewise, change operations that statistically lead to poor fitness function values may be given a lower relative preference for future design explorations.

While, as described to this point, a structure design's "goodness" has been assumed to be purely a matter of its fitness function value, there are many complex and difficult-to-quantify attributes that may weigh in favor of (or against) a particular structure design. The newness (or it's opposite, familiarity), emotional appeal, complexity (for example in a 'how did they do that?' way) are a few examples of such difficult-to-quantify attributes. To factor such attributes into a fitness function it is possible for a user to rank a number of different structure designs and task the system with "learning" what the user likes. This learning may be relatively basic, such as starting a design exploration with a design for which the user has previously indicated a preference, or more complex, such as the system attempting to extract what it is the user prefers from selected structure designs. This process may also be applied in a crowd-source environment, simply by considering the input of a population of people. The individuals or groups whose opinions are considered may be representative of a target audience, such as building developers, tenants, city planners, and so on, or broad-based, such as a random sample of individuals and/or groups. One or more of many methodologies for obtaining feedback in a crowd-source embodiment are possible.

Figure 10:
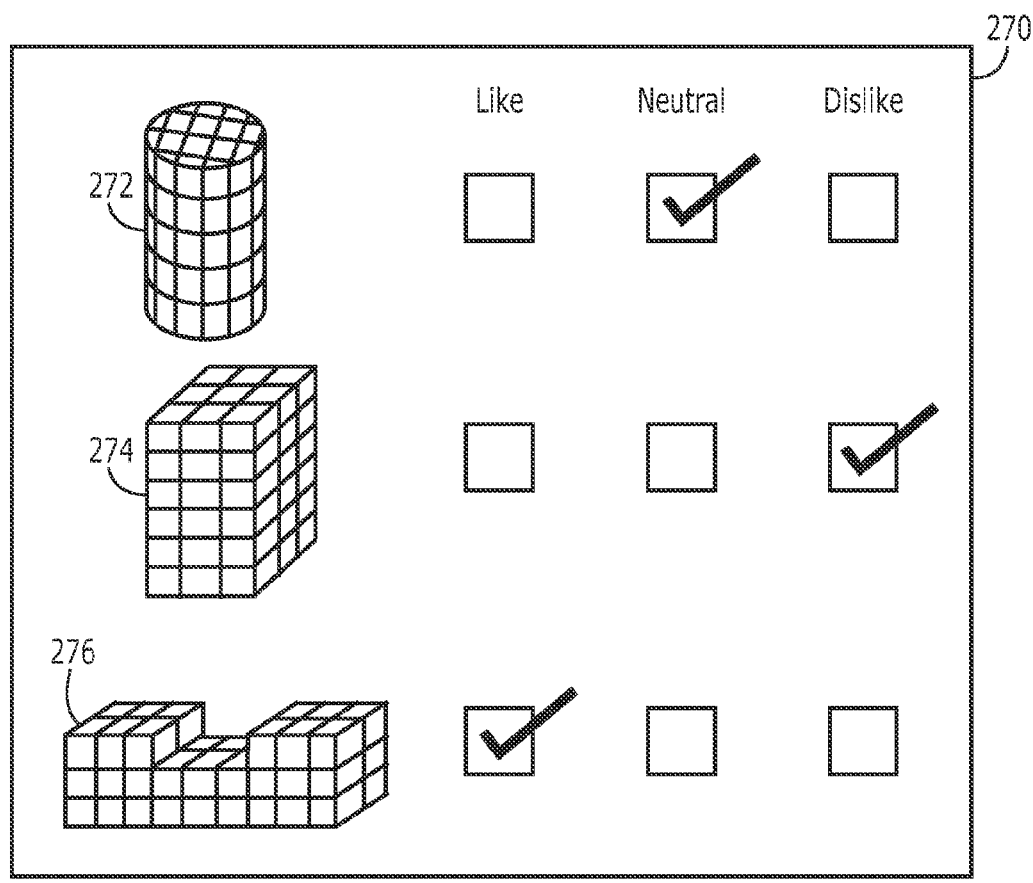
FIG. 10 is still another illustration of a training mode for a computer-implemented system for developing a structure design, in this case for training from group responses to a design survey, according to an embodiment of the present disclosure.

An example of one methodology, a survey may be provided to a target group. A user interface 270 in this example for recording preferences of the participants is shown in FIG. 10. Several different designs 272, 274, 276 are presented to a participant. The participant is provided with check boxes for indicating a positive, neutral or negative impression regarding each design (other interfaces, such as alpha-numeric ratings, sliders, dials, and so forth are contemplated herein). From this example, a system might conclude that the participant completing this survey prefers a lower, spread out structure design as compared to a taller, thinner structure. The system might also (or alternatively) conclude that the participant prefers a structure divided into different sections or elevations, as compared to a monolithic structure. If these results are consistent with those from a survey of a number of participants, these results might be generalized as a preference for the relevant group(s) of participants (e.g., by location, organization, role in a project, etc.) or all users (if appropriate).

Results from such a survey may "teach" the system that one user or group of users may have a different set of preferences than another user or group of users. For example, for one group, this may result in initial states for structures being low, spread out, with multiple sections, and differing elevations. Change operations may be limited so as not to significantly change a design state with these attributes, when appropriate. Likewise (or alternatively), fitness functions may be defined so as to prefer such designs in appropriate cases. For another user or group, with different established preferences, different initial states for structures, with appropriate change operations and fitness functions may drive toward a different optimized design state.

In this way, design iteration may begin with a "head start", having a higher initial fitness function value than a random-start design state. Furthermore, as change operations are performed on the initial design state, the new design state(s) will have an increased probability of improving the fitness function value as compared to random change operations. Even if the fitness function value is not improved, aspects of a new design state may be at least similar to aspects of a preferred design state, and the user may choose to accept those aspects at the cost of a reduced fitness function (i.e., the building may look more as the user intended, and she may prefer to accept that state at the cost of say overage on square footage, decrease in building ROI, or other attribute compromise).

It will be appreciated that while the system disclosed herein may develop and present to a user an optimized design state, the user may choose for one reason or another to override that system-optimized design state in favor of some other design state the user prefers. The preferred design state may be optimized on other attributes (or differently weighted) than those considered by the system, or the design may simply be less optimized than that developed by the system, but preferred by the user for one or more reasons (e.g., better looking to the user). The system can take up the optimization process from that new state, and attempt to further optimize from the user's preferred state, or the final design state may remain as specified by the user, different from the system's optimized design state. The user may also specify that certain aspects of the user's design state (e.g., structure footprint) not be changed while attempting to developed a further optimized design state.

Figure 11:
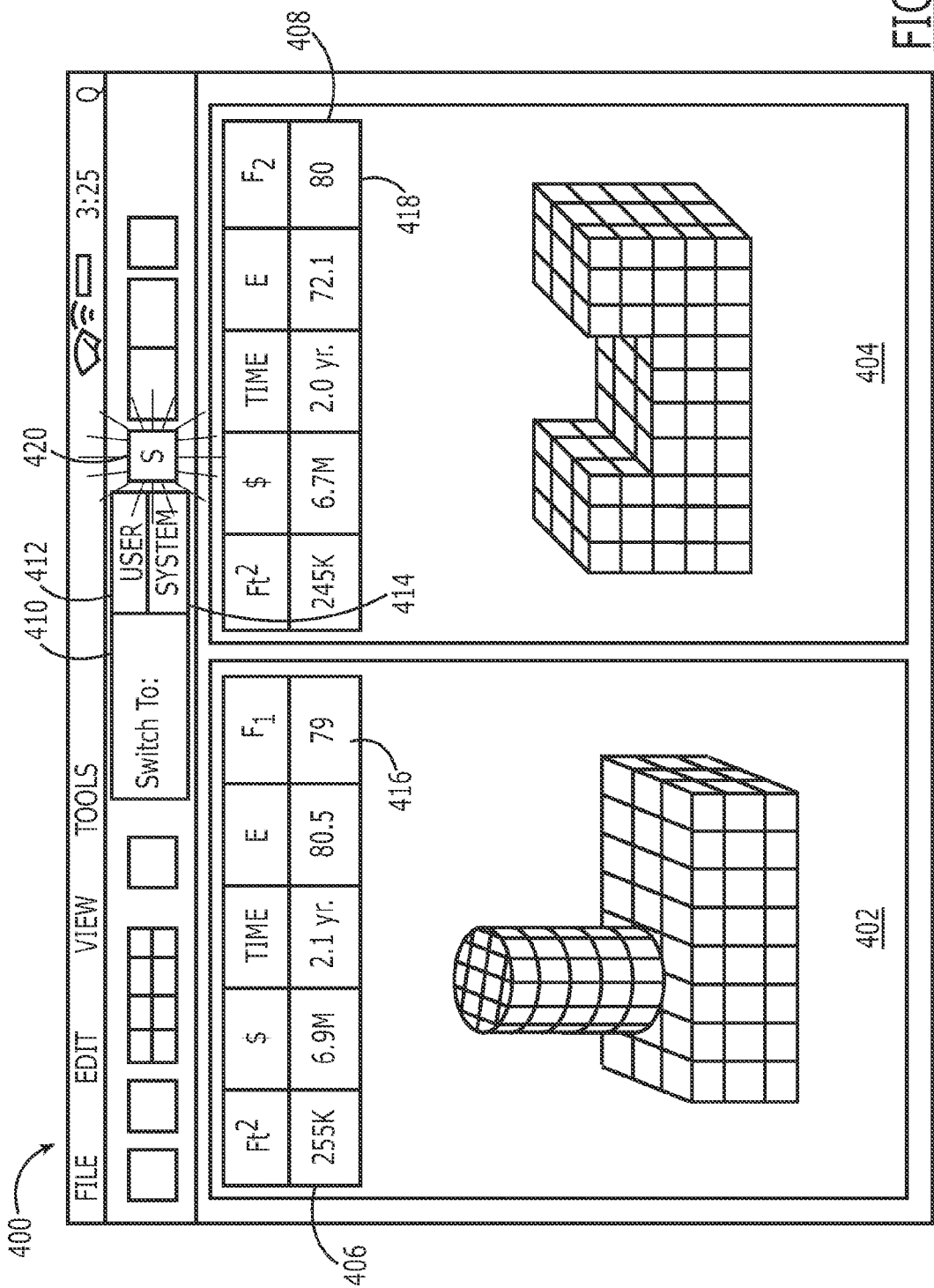
FIG. 11 is an illustration of a user interface permitting a user to view a user-generated structure design and a machine-generated structure design, as associated attribute quantifications, including a mechanism permitting a user to instruct the system to optimize the user-generated structure design, according to an embodiment of the present disclosure.

According to some embodiments of the system and methods disclosed herein, the user and the system may work essentially in parallel, the user pursuing one or more design directions while the system autonomously explores its own different design states for an optimized design. An exemplary user interface 400 for such an embodiment is shown in FIG. 11, in which panel 402 represents the current state of the user's design, while panel 404 represents the current state of the system's design. As the user manipulates her design, certain quantified values relating to the design are calculated and displayed in the dashboard area 406. Similarly, as the system explores different design states, some or all of those quantified values (and potentially others) relating to the design are calculated and displayed in the dashboard area 408. In one embodiment, a fitness function value ($F_1$, $F_2$, respectively) is calculated for each of the user's and system's design states, based at least in part on weighted attributes such as those displayed in the dashboard regions 406, 408 (these fitness function values may also be displayed, for example in the dashboard, for user reference).

In addition to working in parallel, it is possible for the user or system to stop their line of design, and adopt that of the other. For example, if the user wishes to have the system explore variations of the design he is currently developing, he can actuate a decision in a "switch to" control 410, such as by selecting a "user" button 412. This will result in archiving (or abandoning) the current machine design state(s) and the machine copying the user's design state and using that as an initial state in the change-and-test methodology described above. Similarly, if the user wishes to adopt the machine's current state and work from that he may select a "system" button 414. (One instance where this may be useful is where the system has optimized for fitness function value, and the user wishes to alter some aspect of the design, at the possible cost of lowering the overall fitness function value.)

In certain embodiments the fitness function values of the user's design and the system's design are periodically compared, and the user provided with an indication of the relative values of each. In the example of FIG. 11, the overall fitness function value ($F_1$) of the user's current design state is indicated as 79, while the system's function value ($F_2$) is indicated as 80. Similarly, attributes other than fitness function, such as square footage, cost, time-to-completion, and so on, may be compared, and form the basis for choosing a user's design state over a system's, or vice versa. The user may be alerted to this by an indicator 420, which is illuminated when the system's fitness function value exceeds the user's. Many different indication mechanisms are possible, and indeed the indication and the selection of one design state or the other (user's or system's) may be combined into a single control. Accordingly, the above is merely an illustration of comparing fitness function values (and individual attributes) disclosed herein.

In addition to improving the convergence of design to a state optimized for many parameters, the above permits a user to explore the effect of design choices on those attributes or vice versa. For example, the user may focus the design process on an aesthetic target, while the system focuses on a cost target design. In a very simple example, this allows the user to view the "cost" of her design choices. This process may also highlight to a user tradeoffs in a design that may not otherwise have been apparent. For example, the user may identify a change that has little impact on overall cost but improves sunlight or shortens build time. Furthermore, this process may provide the user with a visual cue for manually adjusting attribute weights, ultimately to arrive at a design optimized for a preferred attribute set.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications, variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A computer-implemented system including one or more processors for performing functions of system engines for developing a structure design, comprising:
   a design engine which receives various inputs, and produces a first structure design state;
   an attributes engine, configured to:
   receive a plurality of structure design states including said first structure design state;
   quantify a plurality of measures of various attributes of each said structure design state;
   from said quantified plurality of measures of various attributes of each said structure design state, determine a corresponding structure fitness function value, $$F=f(w_1 a_1, w_2 a_2, \ldots w_n a_n)$$

wherein $a_1$, $a_2$, ... $a_n$ are each a quantification of an attribute, respectively, of said corresponding structure design state, and $w_1$, $w_2$, ... $w_n$ are each a weighting value corresponding to each said attribute quantification, respectively;
   an optimization engine, communicatively connected to said design engine and said attributes engine, configured to:

receive, from said design engine, said first structure design state;

receive, from a change operation selection mechanism responsive to preferred change operations, a first change operation;

apply said first change operation to said first structure design state to thereby obtain a second structure design state;

provide said second structure design state to said attributes engine to thereby obtain a corresponding structure fitness function value;

receive and compare said structure fitness function values corresponding to said first and second structure design states and designating as a selected design state that design state having a greater fitness function value and designating as a non-selected design state that design state having a lesser fitness function value;

a learning engine communicatively coupled to said design engine and said optimization engine and configured to update said change operation selection mechanism such that the change operation producing the selected design state is provided with a preference as compared to the change operation producing the non-selected design state;

a validity checking mechanism for determining whether the second structure design state is a valid design state, and if it is not a valid design state:

said optimization engine:

receiving a second change operation;

applying said second change operation to said first structure design state to thereby obtain a third design state;

providing said third state to said attributes engine to thereby obtain a corresponding structure fitness function value;

receiving and comparing said structure fitness function values corresponding to said first and third design states and designating as a selected design state that design state having a greater fitness function value and designating as a non-selected design state that design state having a lesser fitness function value; and said learning engine updating said change operation selection mechanism such that the change operation producing the selected design state is provided with a preference as compared to the change operation producing the non-selected design state.

2. The computer-implemented system of claim 1, wherein said change operation selection mechanism selects said change operation from a change operation memory, said change operation memory being user-modifiable.

3. The computer-implemented system of claim 1, wherein said design engine, said attributes engine, said optimization engine, and said learning engine are configured to apply change operations to multiple design states, determine a corresponding structure fitness function value for each result of each said application of a change operation to a design state, compare all said fitness function values so as to determine a design state having a maximized fitness function value, further comprising:

a design workspace configured to present to a user said design state having a maximized fitness function value.

4. The computer-implemented system of claim 3, further comprising an interface for providing an indication to a user of said structure fitness function value for said design state having a maximized fitness function value.

5. The computer-implemented system of claim 1, wherein said checking mechanism for determining whether the second structure design state is a valid design state further comprises a validity rules memory, said validity rules memory being user-modifiable.

6. The computer-implemented system of claim 1, wherein said learning engine is configured to update said change operation selection mechanism such that a combination of the change operation and first structure design state producing the invalid second structure design state is provided with a negative preference.

7. The computer-implemented system of claim 1, wherein said design engine is configured to select said first structure design state.

8. The computer-implemented system of claim 1, wherein said design engine is configured such that a user may select said first structure design state.

9. The computer-implemented system of claim 8, wherein said system includes a control permitting said user to designate a user-created design state as said first structure design state.

10. The computer-implemented system of claim 1, wherein said change operation is a compound change operation comprising a plurality of primitive change operations.

11. The computer-implemented system of claim 1, wherein said first change operation is configured so as to avoid an invalid design state.

12. The computer-implemented system of claim 1, wherein said fitness function value is assigned as a lowest fitness function value if said second structure design state is an invalid design state.

13. A computer-implemented system including one or more processors for performing functions of system engines for developing a structure design, comprising:

a design engine, comprising;

a user interface permitting a user to create a first structure design state;

a user interface permitting a user to modify said first structure design state to thereby obtain a second structure design state by way of application of a change operation to said first structure design state, said change operation having a first preference value;

a learning engine, communicatively coupled to said design engine, configured to increase said first preference value associated with a change operation for each instance that said change operation is applied such that said change operation represents a preferred change operation for future design states;

said design engine configured to produce a first machine-generated structure design state;

an attributes engine, configured to:

receive a plurality of structure design states including said first user-generated structure design state and said machine-generated structure design state;

quantify a plurality of measures of various attributes of each said structure design state;

from said quantified plurality of measures of various attributes of each said structure design state, determine a corresponding structure fitness function value, $$F = f(w_1 a_1, w_2 a_2, \ldots a_n)$$

wherein $a_1, a_2, \ldots a_n$ are each a s quantification of an attribute res ectivel of said corresponding structure design state, and $w_1, w_2, \ldots w_n$ are each a weighting value corresponding to each said attribute quantification respectively;

an optimization engine, communicatively connected to said design engine and said attributes engine, configured to:

receive, from said design engine, said first machine generated design state;

receive, from a change operation selection mechanism responsive to preferred change operations, a first change operation;

apply said first change operation to said first machine-generated design state to thereby obtain a second machine-generated design state;

provide said second machine-generated design state to said attributes engine to thereby obtain a corresponding structure fitness function value;

receive and compare said structure fitness function values corresponding to said first and second machine-generated design states and designating as a selected machine-generated design state that design state having a greater fitness function value and designating as a non-selected machine-generated design state that machine-generated design state having a lesser fitness function value;

said learning engine further communicatively coupled to said optimization engine and further configured to update said change operation selection mechanism such that the change operation producing the selected machine-generated design state is provided with a preference as compared to the change operation producing the non-selected machine-generated design state;

a validity checking mechanism for determining whether the second structure design state is a valid design state, and if it is not a valid design state:

said optimization engine:

receiving a second change operation;

applying said second change operation to said first structure design state to thereby obtain a third design state;

providing said third state to said attributes engine to thereby obtain a corresponding structure fitness function value;

receiving and comparing said structure fitness function values corresponding to said first and third design states and designating as a selected design state that design state having a greater fitness function value and designating as a non-selected design state that design state having a lesser fitness function value;

said learning engine updating said change operation selection mechanism such that the change operation producing the selected design state is provided with a preference as compared to the change operation producing the non-selected design state.

14. The computer-implemented system of claim 13, wherein an authorized user may manually adjust said first preference value for said change operation.

15. The computer-implemented system of claim 14, wherein said system is configured to permit multiple users to interact therewith, said learning engine configured to increase said first preference value associated with a change operation only for each instance that a specified user applies said change operation.

16. The computer-implemented system of claim 15, wherein said first preference value associated with a change operation applied by said specified user is used as a first preference value for interactions of other users of said system such that said change operation represents a preferred change operation for future design states produced by said other users.

17. The computer-implemented system of claim 13, further comprising: an interface permitting a user to select said user-generated design state as said first machine-generated structure design state.

18. The computer-implemented system of claim 13, wherein said checking mechanism for determining whether the second structure design state is a valid design state further comprises a validity rules memory, said validity rules memory being user-modifiable.

19. The computer-implemented system of claim 13, wherein said learning engine is configured to update said change operation selection mechanism such that a combination of the change operation and first structure design state producing the invalid second structure design state is provided with a negative preference.

20. A non-transitory computer readable medium having computer program logic stored thereon, which is executable on one or more processors, for assigning a user certification for interaction with a system for designing a structure and coordinating its implementation, the computer program logic comprising:

computer program instructions for inputting to a design engine various inputs, and producing a first structure design state;

computer program instructions for receiving, at an attributes engine, a plurality of structure design states including said first structure design state, each said design state comprised of a plurality of cells, each cell configured to permit it to interconnect with another cell such that a structure design state comprised of cells represents a valid structure design state;

computer program instructions for quantifying, at said attributes engine, a plurality of measures of various attributes of each said structure design state;

computer program instructions for from said quantified plurality of measures of various attributes of each said structure design state, determining a corresponding structure fitness function value, $$F=f(w_1a_1, w_2a_2 \ldots w_na_n)$$

wherein $a_1, a_2, \ldots a_n$ are each a quantification of an attribute, respectively, of said corresponding structure design state, and $w_1, w_2, \ldots w_n$ are each a weighting value corresponding to each said attribute quantification, respectively;

computer program instructions for receiving from said design engine, at an optimization engine communicatively connected to said design engine and said attributes engine, said first structure design state;

computer program instructions for receiving, from a change operation selection mechanism responsive to preferred change operations, communicatively connected to said optimization engine, a first change operation;

computer program instructions for applying at said optimization engine said first change operation to said first structure design state to thereby obtain a second structure design state;

computer program instructions for providing said second structure design state to said attributes engine to thereby obtain a structure fitness function value corresponding to said second structure design state;

computer program instructions for receiving and comparing said structure fitness function values corresponding to said first and second structure design states and designating as a selected design state that design state having a greater fitness function value and designating as a non-selected design state that design state having a lesser fitness function value; and computer program instructions for updating, at a learning engine communicatively coupled to said design engine and said optimization engine, said change operation selection mechanism such that the change operation producing the selected design state is provided with a preference as compared to the change operation producing the non-selected design state;

computer program instructions for determining, at a validity checking mechanism communicatively coupled to said learning engine, whether the second structure design state is a valid design state, and if it is not a valid design state:

computer program instructions for said optimization engine to:
  receive a second change operation;
  apply said second change operation to said first structure design state to thereby obtain a third design state;
  provide said third state to said attributes engine to thereby obtain a corresponding structure fitness function value;
  receive and compare said structure fitness function values corresponding to said first and third design states and designating as a selected design state that design state having a greater fitness function value and designating as a non-selected design state that design state having a lesser fitness function value; and computer program instructions for said learning engine updating said change operation selection mechanism such that the change operation producing the selected design state is provided with a preference as compared to the change operation producing the non-selected design state.

* * * * *